US009793889B2

(12) United States Patent
Bayerer et al.

(10) Patent No.: US 9,793,889 B2
(45) Date of Patent: Oct. 17, 2017

(54) SEMICONDUCTOR DEVICE INCLUDING A CIRCUIT TO COMPENSATE FOR PARASITIC INDUCTANCE

(75) Inventors: Reinhold Bayerer, Warstein (DE);
Piotr Luniewski, Soest (DE)

(73) Assignee: Infineon Technologies AG, Neubiberg (DE)

( * ) Notice: Subject to any disclaimer, the term of this patent is extended or adjusted under 35 U.S.C. 154(b) by 1979 days.

(21) Appl. No.: 13/048,501

(22) Filed: Mar. 15, 2011

(65) Prior Publication Data

US 2012/0235663 A1    Sep. 20, 2012

(51) Int. Cl.
| H03K 17/16  | (2006.01) |
| H03K 17/687 | (2006.01) |
| H03K 19/003 | (2006.01) |
| H02M 1/088  | (2006.01) |

(52) U.S. Cl.
CPC .......... *H03K 17/168* (2013.01); *H02M 1/088* (2013.01); *H03K 17/16* (2013.01); *H03K 17/166* (2013.01); *H01L 2924/0002* (2013.01)

(58) Field of Classification Search
CPC ....... H03K 19/00346; H03K 19/00361; H03K 17/164; H03K 17/168; H03K 17/6872; H03K 17/6874; H03K 2217/0009; H03K 17/16; H03K 17/166; H02M 1/088; H01L 2924/0002
See application file for complete search history.

(56) References Cited

U.S. PATENT DOCUMENTS

| 4,201,957 A | * | 5/1980 | Cathell ........................ 331/110 |
| 4,575,642 A | * | 3/1986 | Hochreutiner et al. ...... 327/389 |
| 5,010,470 A | * | 4/1991 | Lipman et al. ............... 363/132 |
| 5,166,541 A |   | 11/1992 | Mori |
| 6,583,976 B1 | * | 6/2003 | Murahashi et al. .......... 361/100 |
| 6,882,212 B2 |   | 4/2005 | Balakrishnan |

(Continued)

FOREIGN PATENT DOCUMENTS

| EP | 0772288 B1 | 5/1997 |
| EP | 1625660 A1 | 2/2006 |

OTHER PUBLICATIONS

"Power Circuit Design for Clean Switching", Dr. Reinhold Bayerer, et al., Infineon Technologies AG, Integrated Power Electronics Systems (CIPS), 6th International Conference in Apr. 2010. (5 pgs.).

*Primary Examiner* — Lincoln Donovan
*Assistant Examiner* — Colleen O Toole
(74) *Attorney, Agent, or Firm* — Dicke, Billig & Czaja, PLLC

(57) ABSTRACT

A semiconductor device includes a first transistor, a second transistor coupled in parallel with the first transistor, and a first parasitic inductance between an emitter of the first transistor and an emitter of the second transistor. The semiconductor device includes a first circuit configured to provide a first gate driver signal to the first transistor based on a common driver signal and a second circuit configured to provide a second gate driver signal to the second transistor based on the common driver signal. The first circuit and the second circuit are configured to compensate for a voltage drop across the first parasitic inductance such that the first gate driver signal and the second gate driver signal are in phase with and at the same magnitude as the common driver signal.

22 Claims, 12 Drawing Sheets

(56) References Cited

U.S. PATENT DOCUMENTS

| | | |
|---|---|---|
| 7,253,540 B1 | 8/2007 | Thalheim et al. |
| 7,547,992 B2 * | 6/2009 | Hiyama ........................ 307/113 |
| 7,671,639 B2 * | 3/2010 | Schlapbach et al. ......... 327/110 |
| 7,969,208 B2 * | 6/2011 | Jansen .......................... 327/110 |

* cited by examiner

SEMICONDUCTOR DEVICE INCLUDING A CIRCUIT TO COMPENSATE FOR PARASITIC INDUCTANCE

BACKGROUND

Power electronic modules are semiconductor packages that are used in power electronic circuits. Power electronic modules are typically used in vehicular and industrial applications, such as in inverters and rectifiers. The semiconductor components included within the power electronic modules are typically insulated gate bipolar transistor (IGBT) semiconductor chips, metal-oxide-semiconductor field effect transistor (MOSFET) semiconductor chips, junction gate field effect transistor (JFET) semiconductor chips, or other suitable controlled devices. The IGBT and MOSFET semiconductor chips have varying voltage and current ratings. Some power electronic modules also include additional semiconductor diodes (i.e., free-wheeling diodes) in the semiconductor package for free-wheeling currents of inductive loads or for overvoltage protection.

In power electronic modules with paralleled devices (i.e., modules within inverters or converters, and semiconductor chips within modules), an inductive voltage drop occurs from module to module or from semiconductor chip to semiconductor chip if the load or supply current flows in a direction along which the devices are placed. The voltage drop is caused by di/dt in the stray or parasitic inductance between the paralleled devices. The most interfering voltage drop is between emitters (or sources) as these are reflected in the driving (auxiliary) emitters. This voltage drop causes deterioration of the gate drive voltage that is applied as one common gate voltage for all paralleled devices.

For these and other reasons, there is a need for the present invention.

SUMMARY

One embodiment provides a semiconductor device. The semiconductor device includes a first transistor, a second transistor coupled in parallel with the first transistor, and a first parasitic inductance between an emitter of the first transistor and an emitter of the second transistor. The semiconductor device includes a first circuit configured to provide a first gate driver signal to the first transistor based on a common driver signal and a second circuit configured to provide a second gate driver signal to the second transistor based on the common driver signal. The first circuit and the second circuit are configured to compensate for a voltage drop across the first parasitic inductance such that the first gate driver signal and the second gate driver signal are in phase with and at the same magnitude (referenced to each driving emitter) as the common driver signal.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the disclosure may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As used herein, the term "electrically coupled" is not meant to mean that the elements must be directly coupled together and intervening elements may be provided between the "electrically coupled" elements.

Embodiments of the present invention provide power circuits with paralleled devices (i.e., modules within inverters or converters, and semiconductor chips within modules) that compensate for the inductive voltage drop that occurs from module to module or from semiconductor chip to semiconductor chip when the load or supply current flows in a direction along which the devices are placed (i.e., an asymmetric connection to the AC and/or DC power lines). The voltage drop caused by di/dt in the stray or parasitic inductance between the paralleled devices is compensated for such that the gate signal applied to the gate of each individual device is in phase with and at the same magnitude (referenced to each driving emitter) as a common driver signal.

Figure 1:
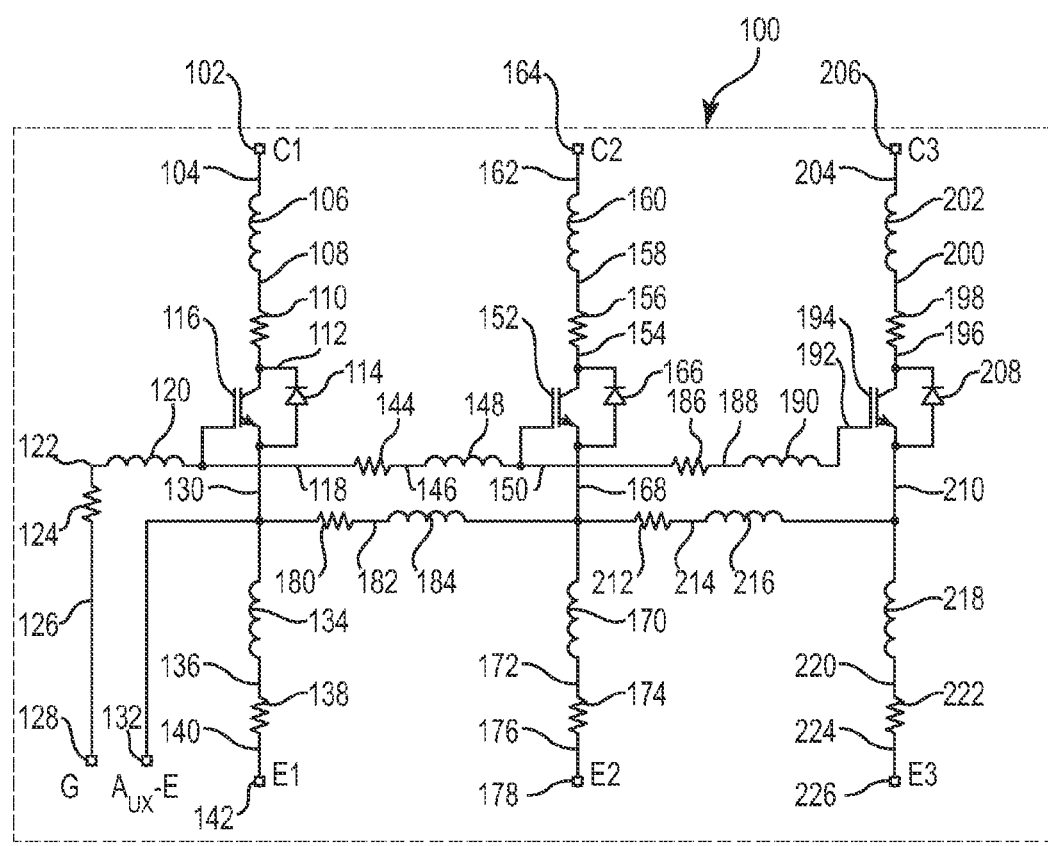
FIG. 1 is a schematic diagram illustrating one embodiment of an equivalent circuit for a single switch including three devices in parallel.

FIG. 1 is a schematic diagram illustrating one embodiment of an equivalent circuit 100 for a single switch including three devices (IGBT, diode) in parallel. While FIG. 1 and the remaining figures disclose IGBTs, MOSFETs, JFETs, or other suitable controlled devices may be used in place of the IGBTs in each of the embodiments disclosed. In one embodiment, circuit 100 may be used in an inverter or rectifier. Equivalent circuit 100 includes resistances 124, 110, 138, 144, 180, 156, 174, 186, 212, 198, and 222. Equivalent circuit 100 also includes inductances 120, 106, 134, 148, 184, 160, 170, 190, 216, 202, and 218. In addition, equivalent circuit 100 includes IGBTs 116, 152, and 194, diodes 114, 166, and 208, collector terminals 102, 164, and 206, emitter terminals 142, 178, and 226, auxiliary emitter terminal 132, and gate terminal 128.

Collector terminal (C1) 102 is electrically coupled to one side of inductance 106 through signal path 104. The other side of inductance 106 is electrically coupled to one side of resistance 110 through signal path 108. The other side of resistance 110 is electrically coupled to the collector of transistor 116 and to the cathode of diode 114 through signal path 112. The emitter of transistor 116 and the anode of diode 114 are electrically coupled to one side of resistance 180, one side of inductance 134, and auxiliary emitter terminal (Aux-E) 132 through signal path 130. The gate of transistor 116 is electrically coupled to one side of resistance 144 and one side of inductance 120 through signal path 118. The other side of inductance 120 is electrically coupled to one side of resistance 124 through signal path 122. The other side of resistance 124 is electrically coupled to gate terminal (G) 128 through signal path 126. The other side of inductance 134 is electrically coupled to one side of resistance 138 through signal path 136. The other side of resistance 138 is electrically coupled to emitter terminal (E1) 142 through signal path 140.

Collector terminal (C2) 164 is electrically coupled to one side of inductance 160 through signal path 162. The other side of inductance 160 is electrically coupled to one side of resistance 156 through signal path 158. The other side of resistance 156 is electrically coupled to the collector of transistor 152 and the cathode of diode 166 through signal path 154. The emitter of transistor 152 and the anode of diode 166 are electrically coupled to one side of inductance 184, one side of resistance 212, and one side of inductance 170 through signal path 168. The gate of transistor 152 is electrically coupled to one side of inductance 148 and one side of resistance 186 through signal path 150. The other side of inductance 148 is electrically coupled to the other side of resistance 144 through signal path 146. The other side of inductance 184 is electrically coupled to the other side of resistance 180 through signal path 182. The other side of inductance 170 is electrically coupled to resistance 174 through signal path 172. The other side of resistance 174 is electrically coupled to emitter terminal (E2) 178 through signal path 176.

Collector terminal (C3) 206 is electrically coupled to one side of inductance 202 through signal path 204. The other side of inductance 202 is electrically coupled to one side of resistance 198 through signal path 200. The other side of resistance 198 is electrically coupled to the collector of transistor 194 and the cathode of diode 208 through signal path 196. The emitter of transistor 194 and the anode of diode 208 are electrically coupled to one side of inductance 216 and one side of inductance 218 through signal path 210. The gate of transistor 194 is electrically coupled to one side of inductance 190 through signal path 192. The other side of inductance 190 is electrically coupled to the other side of resistance 186 through signal path 188. The other side of inductance 216 is electrically coupled to the other side of resistance 212 through signal path 214. The other side of inductance 218 is electrically coupled to one side of resistance 222 through signal path 220. The other side of resistance 222 is electrically coupled to emitter terminal (E3) 226 through signal path 224.

Each resistance in circuit 100 is a parasitic resistance, and each inductance in circuit 100 is a parasitic inductance. Transistors 116, 152, and 194 are electrically connected in parallel. In operation, a gate voltage applied to gate terminal 128 and an auxiliary emitter signal applied to Aux-E terminal 132 are used to control the switching of transistors 116, 152, and 194. Due to resistance 144 and inductance 148, there is voltage drop between the gate voltage applied to the gate of transistor 116 and the gate voltage applied to the gate of transistor 152. Due to resistance 186 and inductance 190, there is an additional voltage drop between the gate voltage applied to the gate of transistor 152 and the gate voltage applied to the gate of transistor 194.

Likewise, due to resistance 180 and inductance 184, there is voltage drop between the auxiliary emitter voltage applied to the auxiliary emitter of transistor 116 and the auxiliary emitter voltage applied to the auxiliary emitter of transistor 152. Due to resistance 212 and inductance 216, there is an additional voltage drop between the auxiliary emitter voltage applied to the auxiliary emitter of transistor 152 and the auxiliary emitter voltage applied to the auxiliary emitter of transistor 194. The resistive voltages induced at the parasitic inductance in the gate and driving emitter circuit can be neglected as the gate current and di/dt of the gate current are rather small compared to those in the external common driver circuit.

Figure 2:
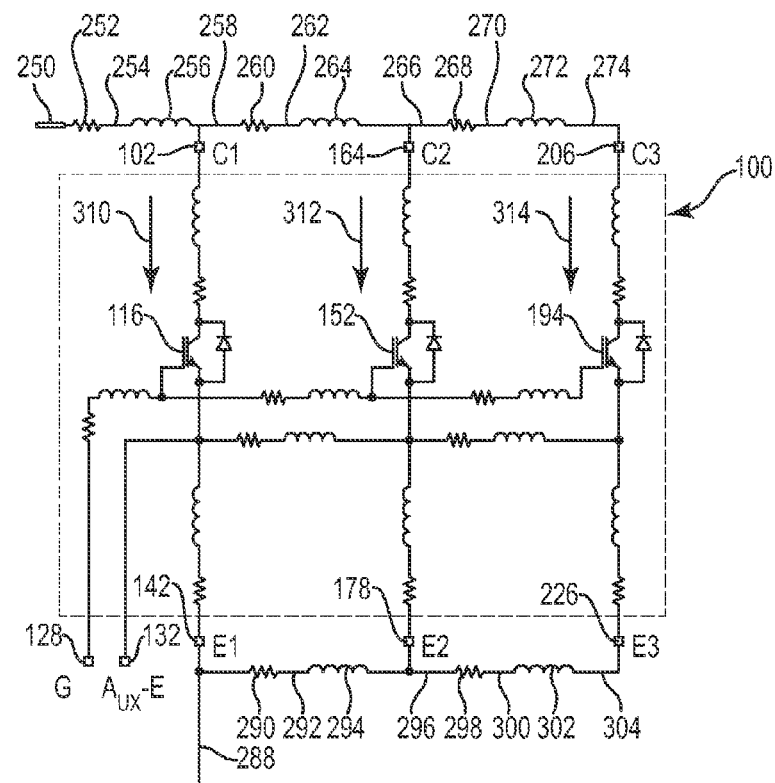
FIG. 2 is a schematic diagram illustrating one embodiment of the equivalent circuit of FIG. 1 including an asymmetric connection of load or supply current.

FIG. 2 is a schematic diagram illustrating one embodiment of equivalent circuit 100 of FIG. 1 including an asymmetric connection of load or supply current. FIG. 2 includes additional resistances 252, 260, 268, 282, 290, and 298 and additional inductances 256, 264, 272, 286, 294, and 302. A load or supply signal path 250 is electrically coupled to one side of resistance 252. The other side of resistance 252 is electrically coupled to one side of inductance 256 through signal path 254. The other side of inductance 256 is electrically coupled to one side of resistance 260 and to collector terminal (C1) 102 through signal path 258. The other side of resistance 260 is electrically coupled to one side of inductance 264 through signal path 262. The other side of inductance 264 is electrically coupled to one side of resistance 268 and to collector terminal (C2) 164 through signal path 266. The other side of resistance 268 is electrically coupled to one side of inductance 272 through signal path 270. The other side of inductance 272 is electrically coupled to collector terminal (C3) 206 through signal path 274.

A load or supply signal path 280 is electrically coupled to one side of resistance 282. The other side of resistance 282 is electrically coupled to one side of inductance 286 through signal path 284. The other side of inductance 286 is electrically coupled to one side of resistance 290 and to emitter terminal (E1) 142 through signal path 288. The other side of resistance 290 is electrically coupled to one side of inductance 294 through signal path 292. The other side of inductance 294 is electrically coupled to one side of resistance 298 and to emitter terminal (E2) 178 through signal path 296. The other side of resistance 298 is electrically coupled to one side of inductance 302 through signal path 300. The other side of inductance 302 is electrically coupled to emitter terminal (E3) 226 through signal path 304.

Each resistance illustrated in FIG. 2 is a parasitic resistance, and each inductance illustrated in FIG. 2 is a parasitic inductance. Due to resistance 260 and inductance 264, there is voltage drop between collector terminal (C1) 102 and collector terminal (C2) 164. Due to resistance 268 and inductance 272, there is an additional voltage drop between collector terminal (C2) 164 and collector terminal (C3) 206. Due to resistance 290 and inductance 294, there is voltage drop between emitter terminal (E1) 142 and emitter terminal (E2) 178. Due to resistance 298 and inductance 302, there is an additional voltage drop between emitter terminal (E2) 178 and emitter terminal (E3) 226. The inductive voltage drop in the emitter inductances causes a voltage shift of the driving emitter causing a gate voltage deterioration of transistors 116, 152, and 194. Thus, as illustrated in FIG. 3, the currents indicated at 310, 312, and 314 are different during turn-on of transistors 116, 152, and 194 in response to common drive signals applied to gate terminal (G) 128 and auxiliary emitter terminal (Aux-E) 132.

Figure 3:
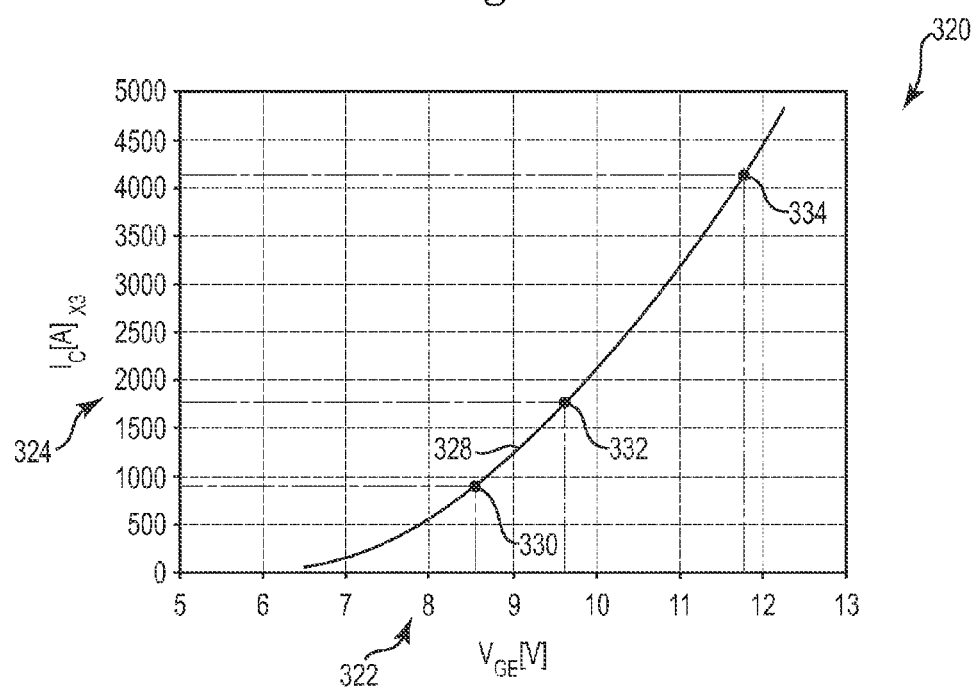
FIG. 3 is a chart illustrating one embodiment of gate to emitter voltages versus current for the equivalent circuit with asymmetric connection of load or supply current as illustrated in FIG. 2.

FIG. 3 is a chart 320 illustrating one embodiment of gate to emitter voltages 322 versus current 324 for the equivalent circuit 100 with asymmetric connection of load or supply current as illustrated in FIG. 2. Line 328 indicates the current $I_c$ at each gate to emitter voltage ($V_{GE}$) times three. In one embodiment, $V_{GE}$ at transistor 116 is approximately 11.8V as indicated at 334, $V_{GE}$ at transistor 152 is approximately 9.6V as indicated at 332, and $V_{GE}$ at transistor 194 is approximately 8.5V as indicated at 330 in response to a gate signal applied to gate terminal 128 and an auxiliary emitter signal applied to auxiliary emitter terminal 132. This results in a turn-on current of approximately 1400 A at 310 through transistor 116 (indicated as 4200A in chart 320), 580 A at 312 through transistor 152 (indicated as 1740A in chart 320), and 300 A at 314 through transistor 194 (indicated as 900A in chart 320). Therefore, during turn-on the current through transistors 116, 152, and 194 is unbalanced.

It is noted that the above description of imbalanced current sharing neglects second order effects by mutual coupling of parasitic inductances. As there is no magnetic material within the space where the parasitic inductance is generated (i.e., relative permeability equals one), mutual coupling has a minor impact on induced voltages and is not considered.

Figure 4:
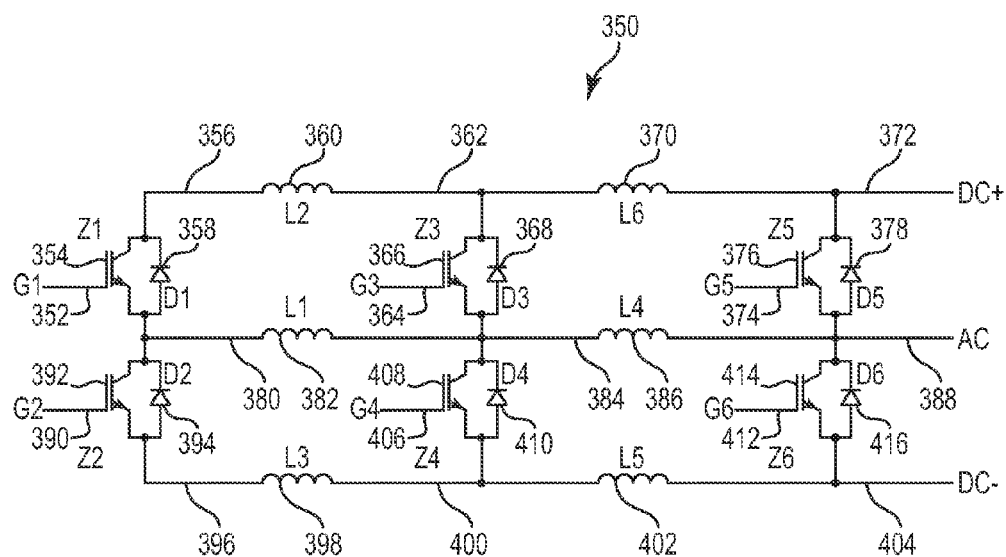
FIG. 4 is a schematic diagram illustrating one embodiment of an equivalent circuit including an asymmetric connection to all three power lines (DC+, DC−, and AC).

FIG. 4 is a schematic diagram illustrating one embodiment of an equivalent circuit 350 including an asymmetric connection to all three power lines (DC+, DC−, and AC). Equivalent circuit 350 includes three half bridges coupled in parallel. Equivalent circuit 350 includes IGBTs 354, 392, 366, 408, 376, and 414. Equivalent circuit 350 also includes diodes 358, 394, 368, 410, 378, and 416. In addition, equivalent circuit 350 includes inductances 360, 382, 398, 370, 386, and 402.

The emitter of transistor (Z1) 354 is electrically coupled to the cathode of diode (D1) 358 and one side of inductance (L2) 360 through signal path 356. The gate of transistor (Z1) 354 is electrically coupled to gate (G1) signal path 352. The emitter of transistor (Z1) 354 is electrically coupled to the anode of diode (D1) 358, one side of inductance (L1) 382, the collector of transistor (Z2) 392, and the cathode of diode (D2) 394 through signal path 380. The emitter of transistor (Z2) 392 is electrically coupled to the anode of diode (D2) 394 and one side of inductance (L3) 398 through signal path 396. The gate of transistor (Z2) 392 is electrically coupled to gate (G2) signal path 390.

The collector of transistor (Z3) 366 is electrically coupled to the cathode of diode (D3) 368, the other side of inductance (L2) 360, and one side of inductance (L6) 370 through signal path 362. The emitter of transistor (Z3) 366 is electrically coupled to the anode of diode (D3) 368, the other side of inductance (L1) 382, one side of inductance (L4) 386, the collector of transistor (Z4) 408, and the cathode of diode (D4) 410 through signal path 384. The gate of transistor (Z3) 366 is electrically coupled to gate (G3) signal path 364. The emitter of transistor (Z4) 408 is electrically coupled to the anode of diode (D4) 410, the other side of inductance (L3) 398, and one side of inductance (L5) 402 through signal path 400. The gate of transistor (Z4) 408 is electrically coupled to gate (G4) signal path 406.

The collector of transistor (Z5) 376 is electrically coupled to the cathode of diode (D5) 378 and the other side of inductance (L6) 370 through DC+ signal path 372. The emitter of transistor (Z5) 376 is electrically coupled to the anode of diode (D5) 378, the other side of inductance (L4) 386, the collector of transistor (Z6) 414, and the cathode of diode (D6) 416 through AC signal path 388. The gate of transistor (Z5) 376 is electrically coupled to gate (G5) signal path 374. The emitter of transistor (Z6) 414 is electrically coupled to the anode of diode (D6) 416 and the other side of inductance (L5) 402 through DC− signal path 404. The gate of transistor (Z6) 414 is electrically coupled to gate (G6) signal path 412. For simplicity, parasitic resistance is not addressed in FIG. 4, but exists similar to FIGS. 1 and 2. It is noted that parasitic resistance causes typical voltage drops in the range of about a few tens of millivolts or a few hundred millivolts, whereas inductances cause typical voltage drops in the range of about a few volts to tens of volts depending on di/dt.

In this embodiment, di/dt on the AC power line 388 causes voltage shifts at L1 and L4. These voltage shifts result in different gate to emitter voltage signals at transistors Z1, Z3, and Z5 during the time di/dt is present. Di/dt on the DC+ power line 372 and on the DC− power line 404 cause voltage shifts at L2, L6, L3, and L5. These voltage shifts result in different gate to emitter voltage signals at transistors Z1, Z3, Z5 and Z2, Z4, Z6 during the time di/dt is present. Therefore, during turn-on the current through transistors Z1, Z3, Z5 and Z2, Z4, Z6 is unbalanced.

Figure 5:
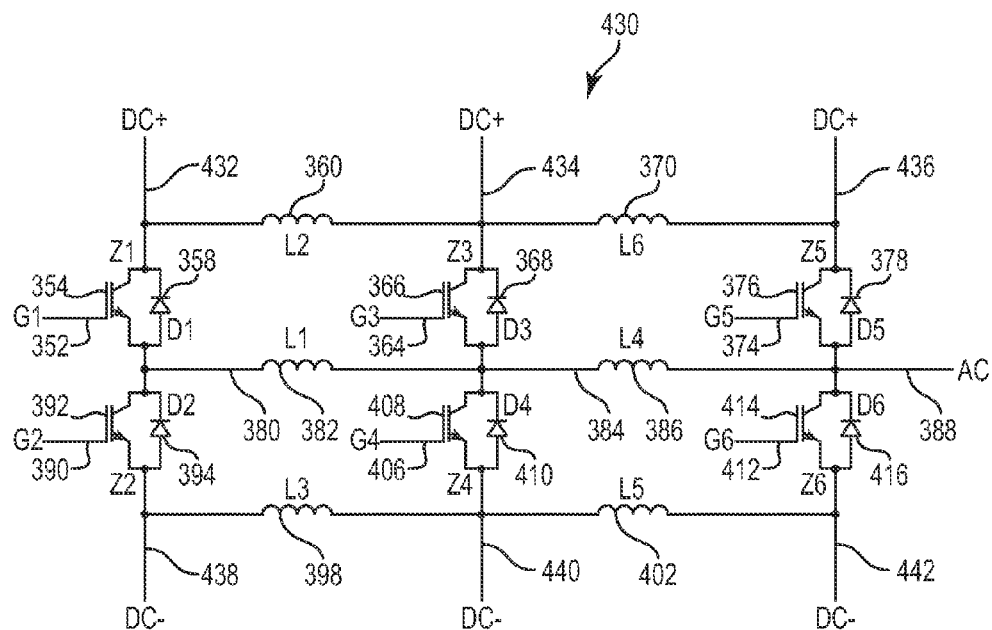
FIG. 5 is a schematic diagram illustrating one embodiment of an equivalent circuit including a symmetric connection to the DC+ and DC− power lines and an asymmetric connection to the AC power line.

FIG. 5 is a schematic diagram illustrating one embodiment of an equivalent circuit 430 including a symmetric connection to the DC+ and DC− power lines and an asymmetric connection to the AC power line. Equivalent circuit 430 includes three half bridges coupled in parallel. Equivalent circuit 430 includes IGBTs 354, 392, 366, 408, 376, and 414. Equivalent circuit 430 also includes diodes 358, 394, 368, 410, 378, and 416. In addition, equivalent circuit 430 includes inductances 360, 382, 398, 370, 386, and 402.

Transistors 354, 392, 366, 408, 376, and 414, diodes 358, 394, 368, 410, 378, and 416, and inductances 360, 382, 398, 370, 386, and 402 are electrically coupled to each other as previously described and illustrated with reference to FIG. 4 except for the connections of the DC+ and DC− power lines. In this embodiment, DC+ signal path 432 is electrically coupled to one side of inductance (L2) 360, the collector of transistor (Z1) 354, and the cathode of diode (D1) 358. DC+ signal path 434 is electrically coupled to the other side of inductance (L2) 360, one side of inductance (L6) 370, the collector of transistor (Z3) 366, and the cathode of diode (D3) 368. DC+ signal path 436 is electrically coupled to the other side of inductance (L6) 370, the collector of transistor (Z5) 376, and the cathode of diode (D5) 378.

DC− signal path 438 is electrically coupled to the emitter of transistor (Z2) 392, the anode of diode (D2) 394, and one side of inductance (L3) 398. DC− signal path 440 is electrically coupled to the other side of inductance (L3) 398, the emitter of transistor (Z4) 408, the anode of diode (D4) 410, and one side of inductance (L5) 402. DC− signal path 442 is electrically coupled to the other side of inductance (L5) 402, the emitter of transistor (Z6) 414, and the anode of diode (D6) 416.

In this embodiment, di/dt on the AC power line 388 causes voltage shifts at L1 and L4. These voltage shifts result in different gate to emitter voltage signals at transistors Z1, Z3, and Z5 during the time di/dt is present. Therefore, during turn-on the current through transistors Z1, Z3, and Z5 is unbalanced.

Figure 6:
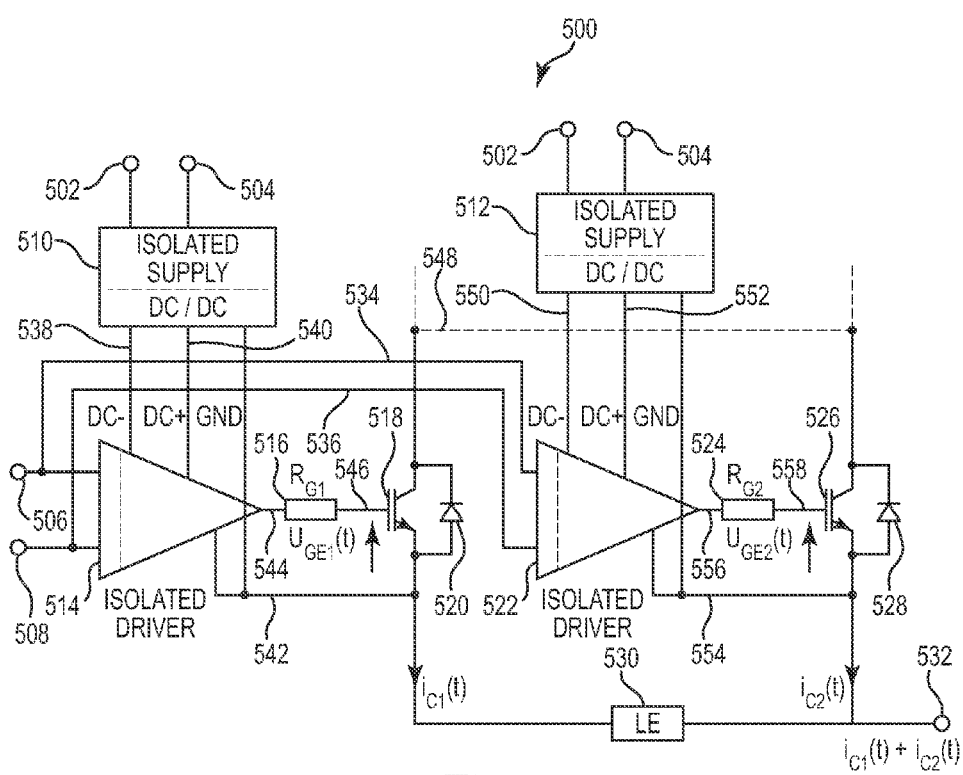
FIG. 6 is a schematic diagram illustrating one embodiment of an equivalent circuit for compensating for the inductive voltage drop between paralleled devices.

FIG. 6 is a schematic diagram illustrating one embodiment of an equivalent circuit 500 for compensating for the inductive voltage drop between paralleled devices. While two paralleled devices are illustrated and described with reference to FIG. 6 and the remaining figures, the disclosure may be applied to any suitable number of paralleled devices, such as three or more. Circuit 500 includes isolated DC/DC voltage supplies 510 and 512, isolated drivers 514 and 522, gate resistances 516 and 524, IGBTs 518 and 526, diodes 520 and 528, and inductance 530.

Inputs of each of isolated DC/DC voltage supplies 510 and 512 receive a DC+ voltage and a DC− voltage from terminals 502 and 504, respectively. Isolated DC/DC voltage supply 510 provides a DC− voltage to a DC− voltage input of isolated driver 514 through signal path 538. Isolated DC/DC voltage supply 510 provides a DC+ voltage to a DC+ voltage input of isolated driver 514 through signal path 540. In addition, isolated DC/DC voltage supply 510 provides a ground (GND) signal (i.e., a reference potential and not necessarily a ground potential) to a ground signal input of isolated driver 514, to the emitter of transistor 518, to the anode of diode 520, and to one side of inductance 530 through signal path 542.

An input of isolated driver 514 receives a gate control signal applied between terminals 506 and 508 through signal paths 534 and 536, respectively. An output of isolated driver 514 is electrically coupled to one side of gate resistance ($R_{G1}$) 516 through signal path 544. The other side of gate resistance ($R_{G1}$) 516 is electrically coupled to the gate of transistor 518 through signal path 546. The collector of transistor 518 is electrically coupled to the cathode of diode 520, and optionally to the collector of transistor 526 and the cathode of diode 528 through signal path 548.

Isolated DC/DC voltage supply 512 provides a DC− voltage to a DC− voltage input of isolated driver 522 through signal path 550. Isolated DC/DC voltage supply 512 provides a DC+ voltage to a DC+ voltage input of isolated driver 522 through signal path 552. In addition, isolated DC/DC voltage supply 512 provides a ground (GND) signal to a ground signal input of isolated driver 522, to the emitter of transistor 526, to the anode of diode 528, and to the other side of inductance 530 through signal path 554.

An input of isolated driver 522 receives the gate control signal applied between terminals 506 and 508 through signal paths 534 and 536, respectively. An output of isolated driver 522 is electrically coupled to one side of gate resistance ($R_{G2}$) 524 through signal path 556. The other side of gate resistance ($R_{G2}$) 524 is electrically coupled to the gate of transistor 526 through signal path 558. The collector of transistor 526 is electrically coupled to the cathode of diode 528, and optionally to the collector of transistor 518 and the cathode of diode 520 through signal path 548. Signal path 554 is electrically coupled to terminal 532.

Isolated DC/DC voltage supply 510 is substantially identical to isolated DC/DC voltage supply 512. In one embodiment, isolated DC/DC voltage supplies 510 and 512 are DC to DC converters for providing an isolated DC voltage to isolated drivers 514 and 522, respectively. In one embodiment, the isolation voltages provided by isolated DC/DC voltage supplies 510 and 512 are within a range of several hundred volts. In one embodiment, the isolation voltages are just high enough to withstand the inductive voltage drops. Isolated driver 514 is substantially identical to isolated driver 522 such that isolated drivers 514 and 522 each have a negligible delay or substantially the same delay. In one embodiment, the difference in delay is less than 10 ns. Isolated drivers 514 and 522 provide galvanic isolation. The galvanic isolation is provided by coreless transformers or other suitable circuits.

To achieve almost identical gate signals (in phase, in magnitude, and in $U_{GE}(t)$-profile) at each transistor 518 and 526, as an example, a digital common gate signal can be transferred to the secondary side of the isolated drivers. There, the digital signals shall have almost no delay among each other (at 544 and 556). Their same magnitude is controlled by the DC-supply voltages 510 and 512 being almost identical, for example within 100 mV. The $V_{GE}(t)$ profile is assured to be the same by usage of precise resistors at the gates of transistors 518 and 526. Furthermore, there is a narrow spread of the transistors' switching characteristic, which can be achieved by common selecting rules for paralleling.

Isolated driver 514 receives the gate signal applied between terminals 506 and 508 and provides an isolated driver signal to the gate of transistor 518. Isolated DC/DC voltage supply 510 and isolated driver 514 shift the driver signal applied to the gate of transistor 518 to compensate for the inductive voltage drop across inductance 530. Isolated driver 522 receives the gate signal applied between terminals 506 and 508 and provides an isolated driver signal to the gate of transistor 526. Isolated DC/DC voltage supply 512 and isolated driver 522 shift the driver signal applied to the gate of transistor 526 to compensate for the inductive voltage drop across inductance 530.

By compensating for the inductive voltage drop, the profile (i.e., voltage and time) of the common gate signal applied between terminals 506 and 508 is reproduced to provide the driver signal for transistor 510 as indicated by $U_{GE1}(t)$ and the driver signal for transistor 526 as indicated by $U_{GE2}(t)$ with just some shift in voltage and with some delay. Thus, $U_{GE1}(t)$ for transistor 518 substantially equals $U_{GE2}(t)$ for transistor 526 and the current through transistor 518 as indicated by $i_{C1}(t)$ substantially equals the current through transistor 526 as indicated by $i_{C2}(t)$. The currents $i_{C1}(t)$ and $i_{C2}(t)$ are summed to provide the current at terminal 532.

Figure 7:
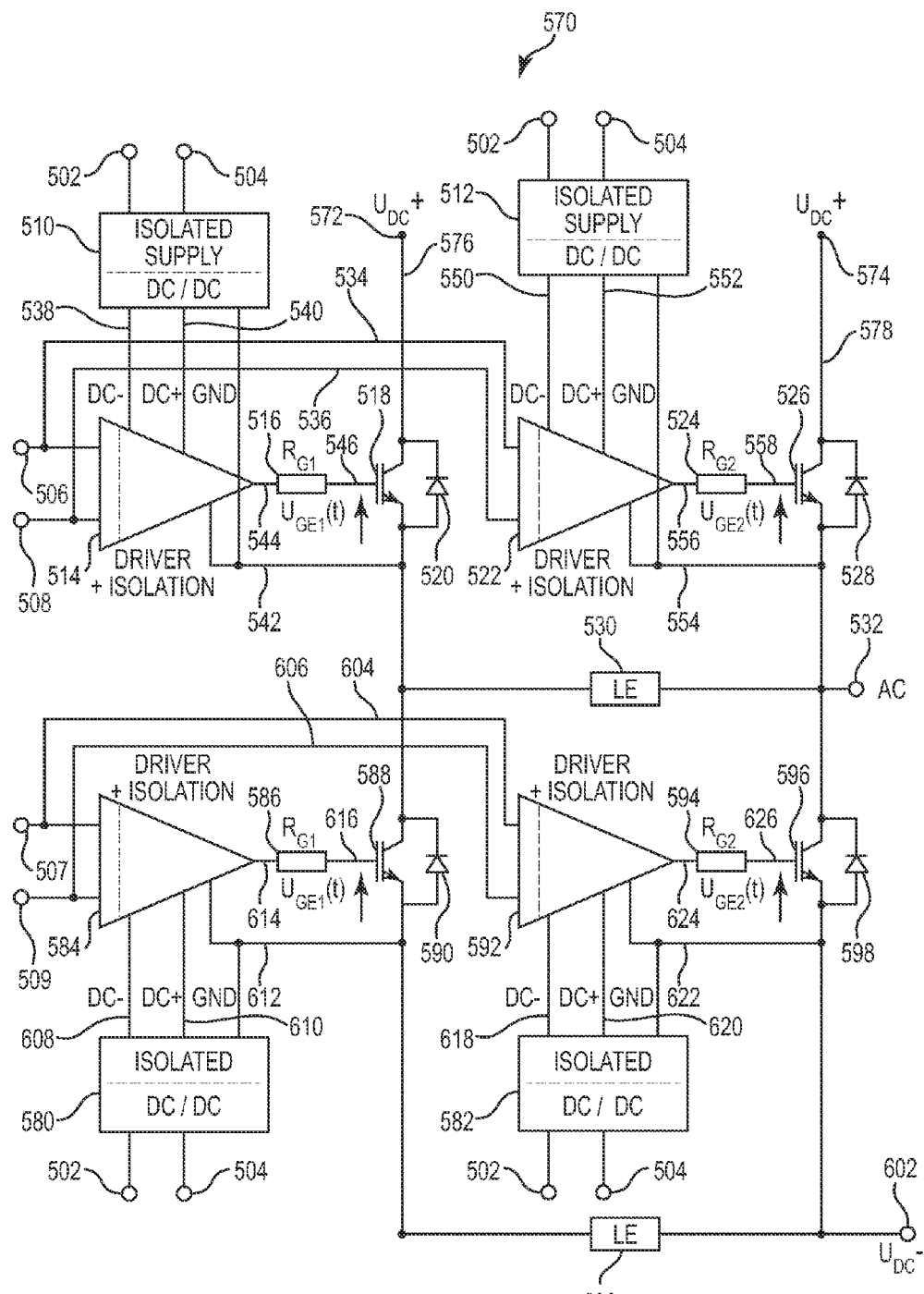
FIG. 7 is a schematic diagram illustrating another embodiment of an equivalent circuit for compensating for the inductive voltage drop between paralleled devices.

FIG. 7 is a schematic diagram illustrating another embodiment of an equivalent circuit 570 for compensating for the inductive voltage drop between paralleled devices. Circuit 570 includes two circuits similar to circuit 500 previously described and illustrated with reference to FIG. 6 connected in a half bridge configuration. Circuit 570 includes circuit 500 with the collector of transistor 518 and the cathode of diode 520 electrically coupled to voltage ($U_{DC+}$) terminal 572 through signal path 576, and with the collector of transistor 526 and the cathode of diode 528 electrically coupled to voltage ($U_{DC+}$) terminal 574 through signal path 578.

In addition, circuit 570 includes isolated DC/DC voltage supplies 580 and 582, isolated drivers 584 and 592, gate resistances 586 and 594, IGBTs 588 and 596, diodes 590 and 598, and inductance 600. Inputs of each of isolated DC/DC voltage supplies 580 and 582 receive a DC+ voltage and a DC− voltage from terminals 502 and 504, respectively. Isolated DC/DC voltage supply 580 provides a DC− voltage to a DC− voltage input of isolated driver 584 through signal path 608. Isolated DC/DC voltage supply 580 provides a DC+ voltage to a DC+ voltage input of isolated driver 584 through signal path 610. In addition, isolated DC/DC voltage supply 580 provides a ground (GND) signal to a ground signal input of isolated driver 584, to the emitter of transistor 588, to the anode of diode 590, and to one side of inductance 600 through signal path 612.

An input of isolated driver 584 receives a gate control signal applied between terminals 507 and 509 through signal paths 604 and 606, respectively. An output of isolated driver 584 is electrically coupled to one side of gate resistance ($R_{G1}$) 586 through signal path 614. The other side of gate resistance ($R_{G1}$) 586 is electrically coupled to the gate of transistor 588 through signal path 616. The collector of transistor 588 is electrically coupled to the cathode of diode 590 and one side of inductance 530 through signal path 542.

Isolated DC/DC voltage supply 582 provides a DC− voltage to a DC− voltage input of isolated driver 592 through signal path 618. Isolated DC/DC voltage supply 582 provides a DC+ voltage to a DC+ voltage input of isolated driver 592 through signal path 620. In addition, isolated DC/DC voltage supply 582 provides a ground (GND) signal to a ground signal input of isolated driver 592, to the emitter of transistor 596, to the anode of diode 598, and to the other side of inductance 600 through signal path 622.

An input of isolated driver 592 receives the gate control signal applied between terminals 507 and 509 through signal paths 604 and 606, respectively. An output of isolated driver 592 is electrically coupled to one side of gate resistance ($R_{G2}$) 594 through signal path 624. The other side of gate resistance ($R_{G2}$) 594 is electrically coupled to the gate of transistor 596 through signal path 626. The collector of transistor 596 is electrically coupled to the cathode of diode 598 and to the other side of inductance 530 through signal path 554. Signal path 554 is electrically coupled to AC terminal 532. Signal path 622 is electrically coupled to voltage ($U_{DC-}$) terminal 602.

Isolated DC/DC voltage supply 580 is substantially identical to isolated DC/DC voltage supply 582 and isolated DC/DC voltage supplies 510 and 512 previously described. In one embodiment, the isolation voltages provided by isolated DC/DC voltage supplies 510, 512, 580, and 582 are within a range of several kilovolts, such as up to 10 kV. In one embodiment, isolated DC/DC voltage supplies 580 and 582 are DC to DC converters for providing an isolated DC voltage to isolated drivers 584 and 592, respectively. Isolated driver 584 is substantially identical to isolated driver 592 and isolated drivers 514 and 522 previously described such that isolated drivers 584 and 592 each have a negligible delay or substantially the same delay.

Isolated driver 584 receives the gate signal applied between terminals 507 and 509 and provides an isolated driver signal to the gate of transistor 588. Isolated DC/DC voltage supply 580 and isolated driver 584 shift the driver signal applied to the gate of transistor 588 to compensate for the inductive voltage drop across inductance 600. Isolated driver 592 receives the gate signal applied between terminals 507 and 509 and provides an isolated driver signal to the gate of transistor 596. Isolated DC/DC voltage supply 582 and isolated driver 592 shift the driver signal applied to the gate of transistor 596 to compensate for the inductive voltage drop across inductance 600.

By compensating for the inductive voltage drop, the profile (i.e., voltage and time) of the common gate signal applied between terminals 507 and 509 is reproduced to provide the driver signal for transistor 588 as indicated by $U_{GE1}(t)$ and the driver signal for transistor 596 as indicated by $U_{GE2}(t)$ with just some shift in voltage and with some delay. Thus, $U_{GE1}(t)$ for transistor 588 substantially equals $U_{GE2}(t)$ for transistor 596 and the current through transistor 588 substantially equals the current through transistor 596 during turn-on.

Figure 8:
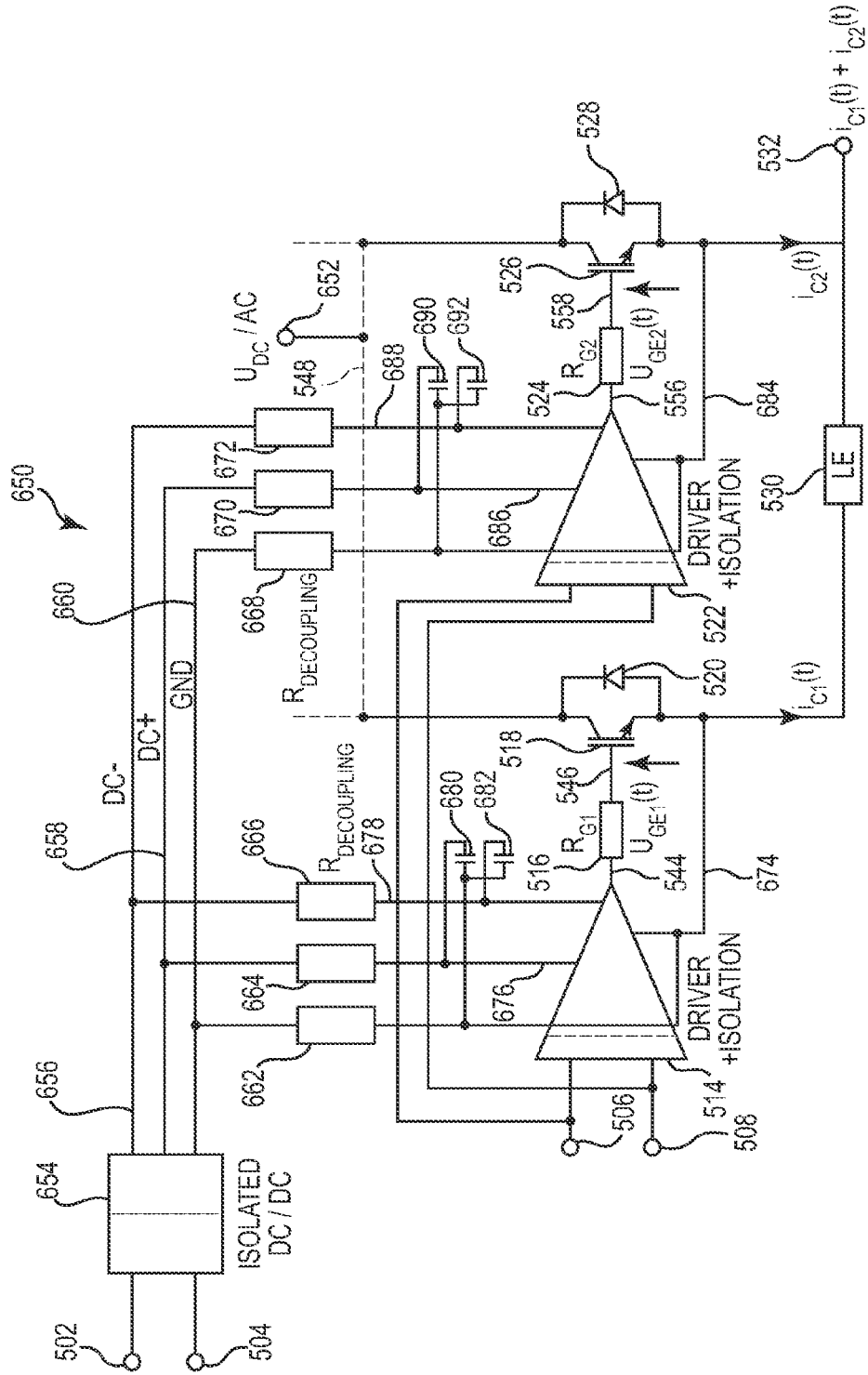
FIG. 8 is a schematic diagram illustrating another embodiment of an equivalent circuit for compensating for the inductive voltage drop between paralleled devices.

FIG. 8 is a schematic diagram illustrating another embodiment of an equivalent circuit 650 for compensating for the inductive voltage drop between paralleled devices. Circuit 650 is similar to circuit 500 previously described and illustrated with reference to FIG. 6, except that circuit 650 includes a single isolated DC/DC voltage supply 654, decoupling resistors 662, 664, 666, 668, 670, and 672, and capacitors 680, 682, 690, and 692.

Inputs of isolated DC/DC voltage supply 654 receive a DC+ voltage and a DC− voltage from terminals 502 and 504, respectively. Isolated DC/DC voltage supply 654 provides a DC− voltage to one side of resistor 666 and one side of resistor 672 through signal path 656. Isolated DC/DC voltage supply 654 provides a DC+ voltage to one side of resistor 664 and one side of resistor 670 through signal path 658. In addition, isolated DC/DC voltage supply 654 provides a ground (GND) signal to one side of resistor 662 and one side of resistor 668 through signal path 660.

The other side of resistor 662 is electrically coupled to one side of capacitor 680, one side of capacitor 682, a ground signal input of isolated driver 514, the emitter of transistor 518, the anode of diode 520, and one side of inductance 530 through signal path 674. The other side of resistor 664 is electrically coupled to the other side of capacitor 680 and to a DC+ voltage input of isolated driver 514 through signal path 676. The other side of resistor 666 is electrically coupled to the other side of capacitor 682 and to a DC− voltage input of isolated driver 514 through signal path 678.

The other side of resistor 668 is electrically coupled to one side of capacitor 690, one side of capacitor 692, a ground signal input of isolated driver 522, the emitter of transistor 526, the anode of diode 528, and the other side of inductance 530 through signal path 684. The other side of resistor 670 is electrically coupled to the other side of capacitor 690 and to a DC+ voltage input of isolated driver 522 through signal path 686. The other side of resistor 672 is electrically coupled to the other side of capacitor 692 and to a DC− voltage input of isolated driver 522 through signal path 688.

In this embodiment, in place of using separate isolated DC/DC voltage supplies for each isolated driver 514 and 522, a single isolated DC/DC voltage supply 654, decoupling resistors 662, 664, 666, 668, 670, and 672, and capacitors 680, 682, 690, and 692 are used. Isolated driver 514 and decoupling resistors 662, 664, and 666 shift the driver signal applied to the gate of transistor 518 to compensate for the inductive voltage drop across inductance 530. Capacitors 680 and 682 hold the local, individual voltages during transitions. Isolated driver 522 and decoupling resistors 668, 670, and 672 shift the driver signal applied to the gate of transistor 526 to compensate for the inductive voltage drop across inductance 530. Capacitors 690 and 692 hold the local, individual voltages during transitions. Thus, $U_{GE1}(t)$ for transistor 518 substantially equals $U_{GE2}(t)$ for transistor 526 and the current through transistor 518 as indicated by $i_{C1}(t)$ substantially equals the current through transistor 526 as indicated by $i_{C2}(t)$.

Figure 9:
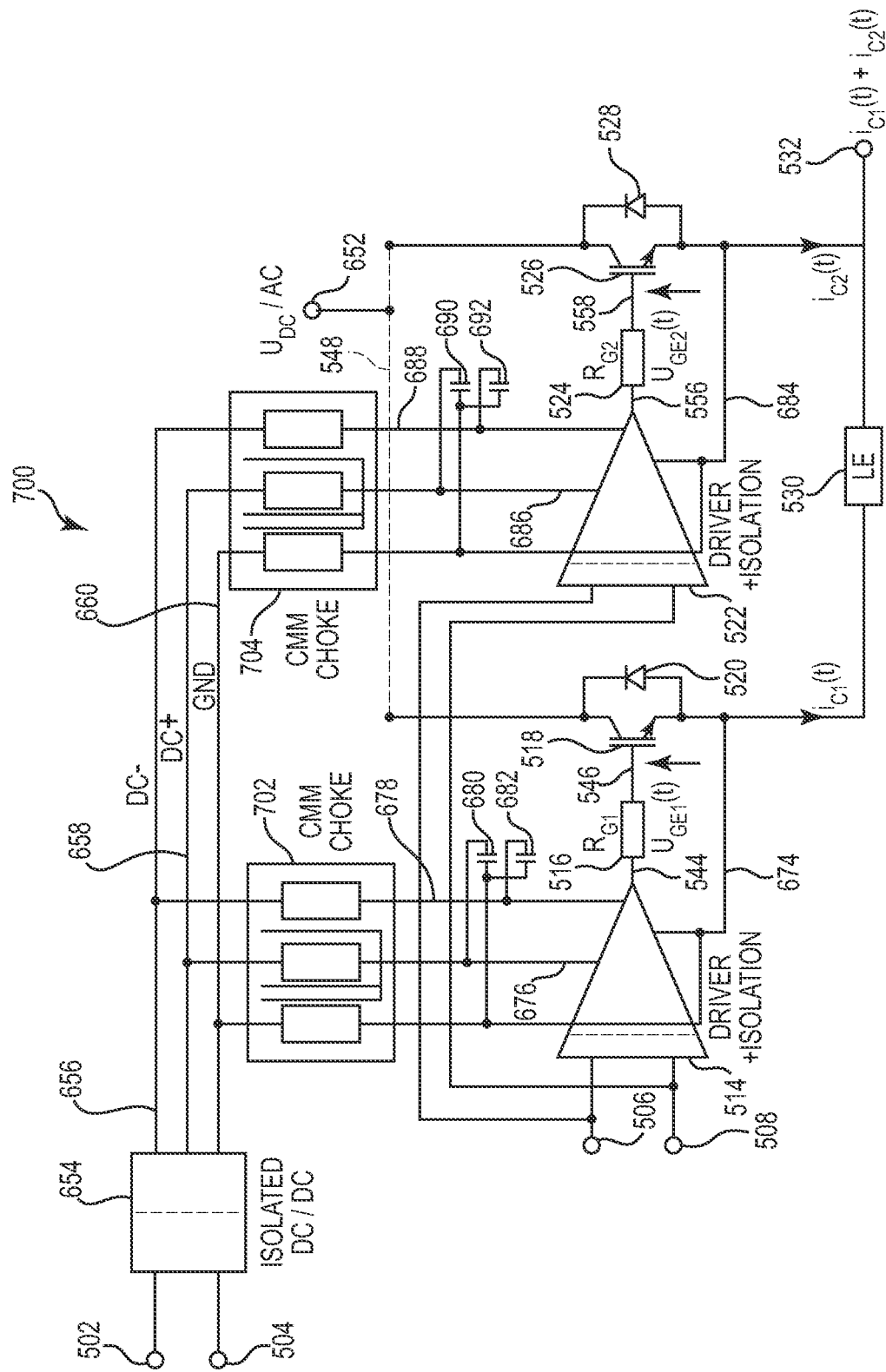
FIG. 9 is a schematic diagram illustrating another embodiment of an equivalent circuit for compensating for the inductive voltage drop between paralleled devices.

FIG. 9 is a schematic diagram illustrating another embodiment of an equivalent circuit 700 for compensating for the inductive voltage drop between paralleled devices. Circuit 700 is similar to circuit 650 previously described and illustrated with reference to FIG. 8, except that in circuit 700 the decoupling resistors are replaced with Coupled Common Mode (CMM) chokes 702 and 704. One side of CCM choke 702 is electrically coupled to ground signal path 660, DC+ voltage signal path 658, and DC− voltage signal path 656, while the other side of CMM choke 702 is electrically coupled to signal paths 674, 676, and 678, respectively. One side of CMM choke 704 is electrically coupled to ground signal path 660, DC+ voltage signal path 658, and DC− voltage signal path 656, while the other side of CMM choke 704 is electrically coupled to signal paths 684, 686, and 688, respectively.

In this embodiment, in place of using separate isolated DC/DC voltage supplies for each isolated driver 514 and 522, a single isolated DC/DC voltage supply 654, CCM chokes 701 and 704, and capacitors 680, 682, 690, and 692 are used. Isolated driver 514 and CCM choke 702 shift the driver signal applied to the gate of transistor 518 to compensate for the inductive voltage drop across inductance 530. Capacitors 680 and 682 hold the local, individual voltages during transitions. Isolated driver 522 and CCM choke 704 shift the driver signal applied to the gate of transistor 526 to compensate for the inductive voltage drop across inductance 530. Capacitors 690 and 692 hold the local, individual voltages during transitions. Thus, $U_{GE1}(t)$ for transistor 518 substantially equals $U_{GE2}(t)$ for transistor 526 and the current through transistor 518 as indicated by $i_{C1}(t)$ substantially equals the current through transistor 526 as indicated by $i_{C2}(t)$.

Figure 10:
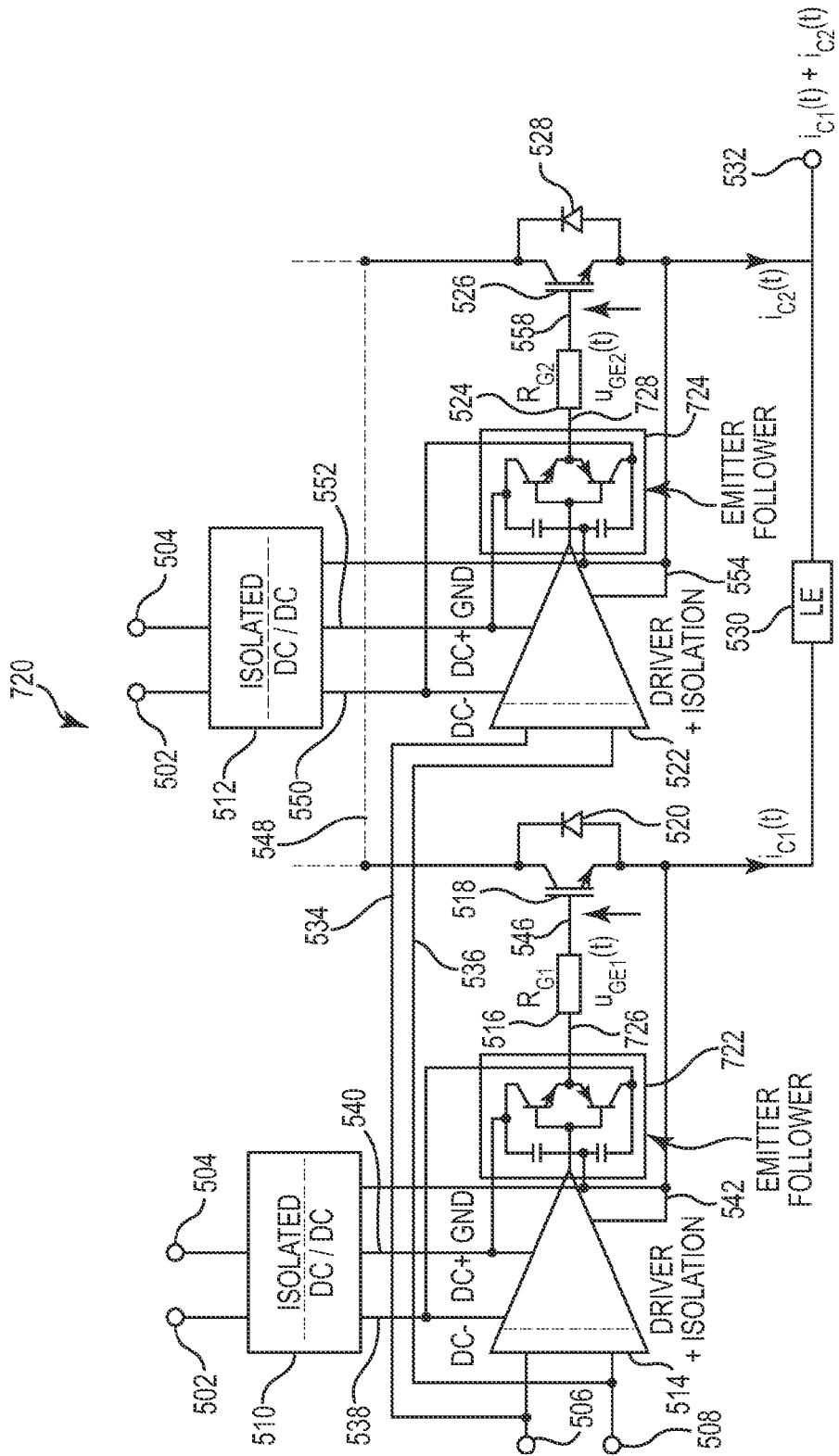
FIG. 10 is a schematic diagram illustrating another embodiment of an equivalent circuit for compensating for the inductive voltage drop between paralleled devices.

FIG. 10 is a schematic diagram illustrating another embodiment of an equivalent circuit 720 for compensating for the inductive voltage drop between paralleled devices. Circuit 720 is similar to circuit 500 previously described and illustrated with reference to FIG. 6, except circuit 720 includes emitter followers 722 and 724. The output of isolated driver 514 is electrically coupled to an input of emitter follower 722. In addition, inputs of emitter follower 722 receive the DC-voltage on signal path 538, the DC+ voltage on signal path 540, and the ground signal on signal path 542. The output of emitter follower 522 is electrically coupled to one side of gate resistance ($R_{G1}$) 516 through signal path 726.

The output of isolated driver 522 is electrically coupled to an input of emitter follower 724. In addition, inputs of emitter follower 724 receive the DC-voltage on signal path 550, the DC+ voltage on signal path 552, and the ground signal on signal path 554. The output of emitter follower 724 is electrically coupled to one side of gate resistance ($R_{G2}$) 524 through signal path 728.

Figure 14A:
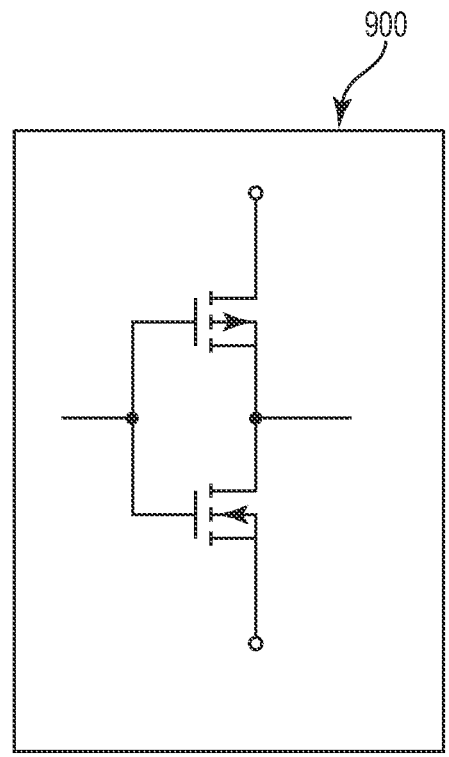
FIG. 14A illustrates one embodiment of a push-pull amplifier to use in place of the emitter followers illustrated in FIGS. 10 and 11.
Figure 14B:
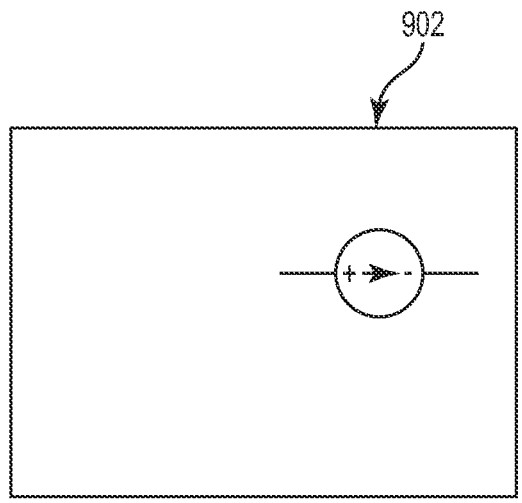
FIG. 14B illustrates one embodiment of a voltage controlled current source to use in place of the emitter followers illustrated in FIGS. 10 and 11.

In this embodiment, emitter followers 722 and 724 are arranged between the isolated drivers 514 and 522 and the gates of transistors 518 and 526, respectively. In other embodiments, each emitter follower 722 and 724 is replaced with another suitable current amplifier, such as a push-pull amplifier 900 as illustrated in FIG. 14A or a voltage controlled current source 902 as illustrated in FIG. 14B. Isolated DC/DC voltage supply 510, isolated driver 514, and emitter follower 722 shift the driver signal applied to the gate of transistor 518 to compensate for the inductive voltage drop across inductance 530. Isolated DC/DC voltage supply 512, isolated driver 522, and emitter follower 724 shift the driver signal applied to the gate of transistor 526 to compensate for the inductive voltage drop across inductance 530. Thus, $U_{GE1}(t)$ for transistor 518 substantially equals $U_{GE2}(t)$ for transistor 526 and the current through transistor 518 as indicated by $i_{C1}(t)$ substantially equals the current through transistor 526 as indicated by $i_{C2}(t)$.

Figure 11:
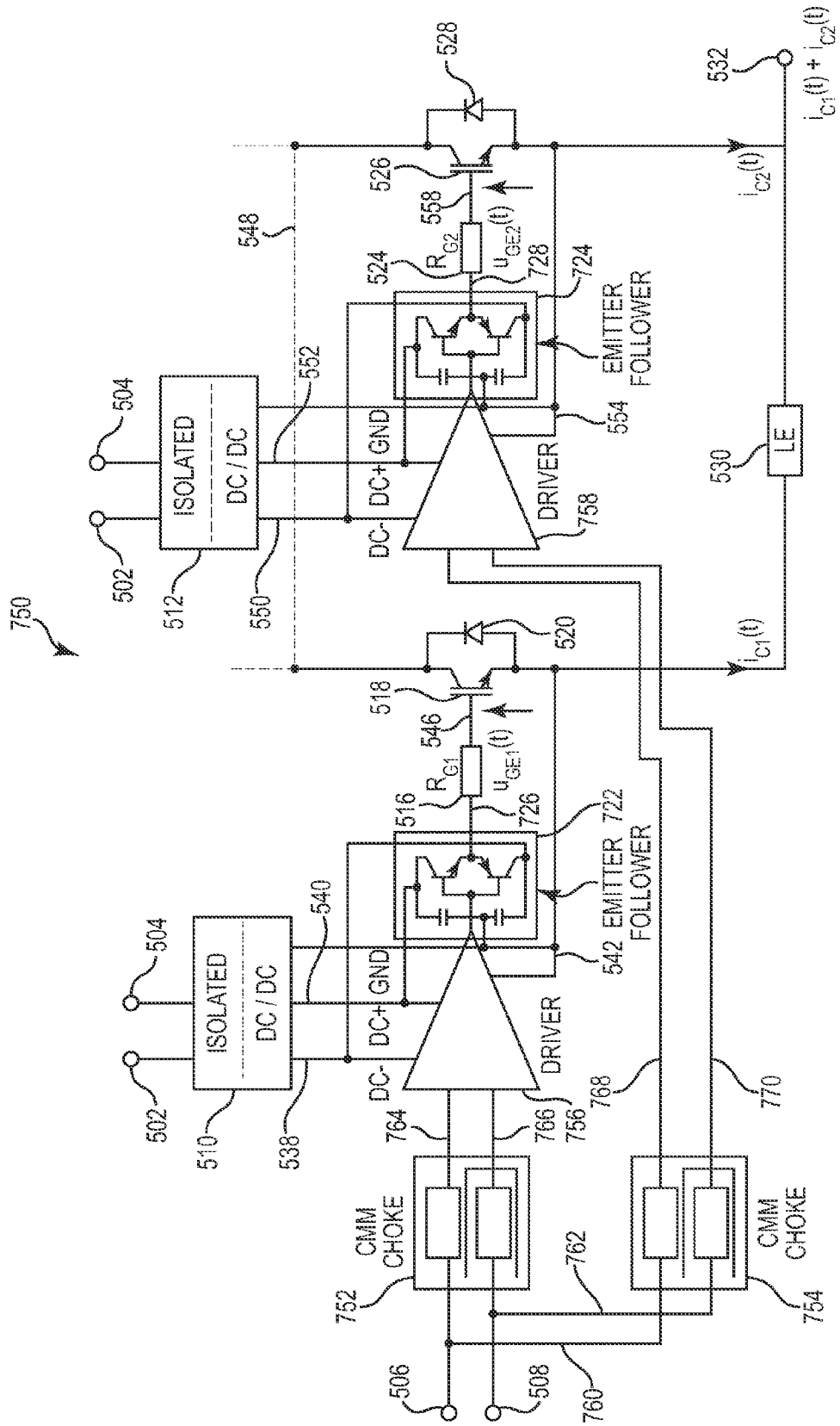
FIG. 11 is a schematic diagram illustrating another embodiment of an equivalent circuit for compensating for the inductive voltage drop between paralleled devices.

FIG. 11 is a schematic diagram illustrating another embodiment of an equivalent circuit 750 for compensating for the inductive voltage drop between paralleled devices. Circuit 750 is similar to circuit 720 previously described and illustrated with reference to FIG. 10, except that in circuit 750 isolated drivers 514 and 522 are replaced with non-isolated drivers 756 and 758 and Coupled Common Mode (CMM) chokes 752 and 754. The input of CMM choke 752 is electrically coupled to gate control signal terminals 506 and 508 through signal paths 760 and 762, respectively, while the output of CCM choke 752 is electrically coupled to the input of driver 756 through signal paths 764 and 766, respectively. The input of CMM choke 754 is electrically coupled to gate control signal terminals 506 and 508 through signal paths 760 and 762, respectively, while the output of CCM choke 754 is electrically coupled to the input of driver 758 through signal paths 768 and 770, respectively.

In this embodiment, emitter followers 722 and 724 are arranged between non-isolated drivers 756 and 758 and the gates of transistors 518 and 526, respectively. In addition, CCM chokes 752 and 754 are arranged prior to the non-isolated drivers 756 and 758, respectively. In other embodiments, each emitter follower 722 and 724 is replaced with another suitable current amplifier, such as a push-pull amplifier 900 as illustrated in FIG. 14A or a voltage controlled current source 902 as illustrated in FIG. 14B. Isolated DC/DC voltage supply 510, CCM choke 752, driver 756, and emitter follower 722 shift the driver signal applied to the gate of transistor 518 to compensate for the inductive voltage drop across inductance 530. Isolated DC/DC voltage supply 512, CMM choke 754, driver 758, and emitter follower 724 shift the driver signal applied to the gate of transistor 526 to compensate for the inductive voltage drop across inductance 530. Thus, $U_{GE1}(t)$ for transistor 518 substantially equals $U_{GE2}(t)$ for transistor 526 and the current through transistor 518 as indicated by $i_{C1}(t)$ substantially equals the current through transistor 526 as indicated by $i_{C2}(t)$.

Figure 12:
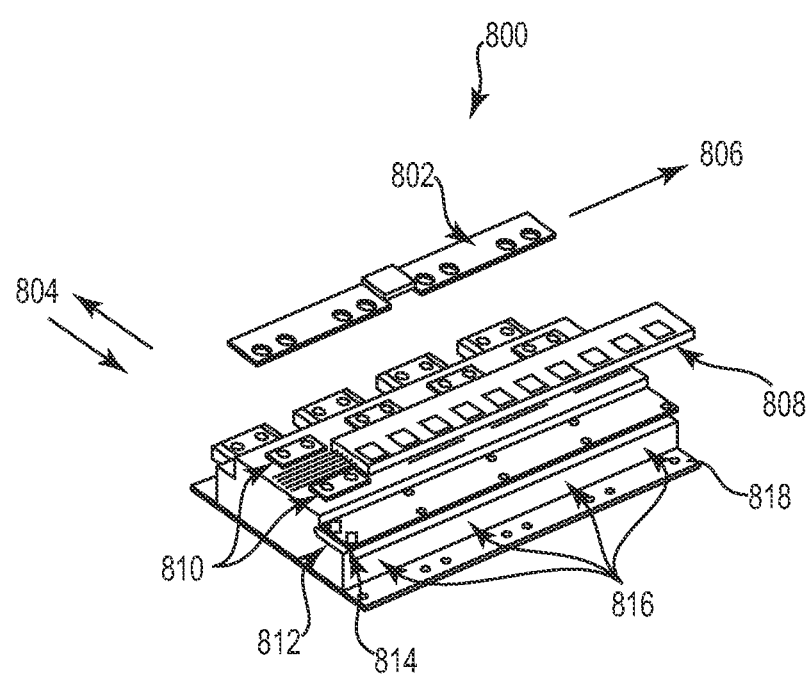
FIG. 12 is a diagram illustrating an exploded view of one embodiment of a power module.
Figure 13:
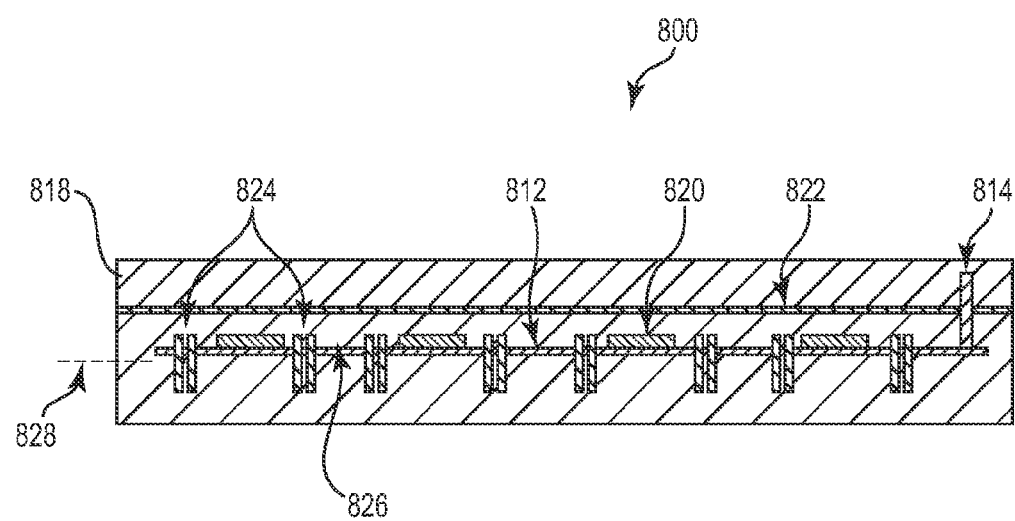
FIG. 13 illustrates a cross-sectional view of one embodiment of a power module.

FIG. 12 is a diagram illustrating an exploded view of one embodiment of a power module 800. FIG. 13 illustrates a cross-sectional view of one embodiment of power module 800. Power module 800 includes an AC connection bar 802, a cap 808, paralleled devices 816, common gate terminals 814, a driver board 812, and DC+ and DC− terminals 810. AC connection bar 802 is arranged such that the phase current (i.e., AC current) flows along the length of the module 800 as indicated at 806. The DC (+/−) current is symmetric and flows perpendicular to the row of paralleled devices 816 as indicated at 804.

In one embodiment, driver board 812 is a printed circuit board (PCB) and includes the circuitry 820 for driving paralleled devices 816, drive terminals 824 for each segment, common gate and emitter terminals 814, common gate signal paths to the individual devices, common gate supply connectors, and the individual voltage supplies. In one embodiment, driver board 812 is attached to the module by press fit connectors. In another embodiment, driver board 812 is attached to the module by spring or soldered connectors. In yet another embodiment, driver board 812 is attached to the module by laser welded interconnects. Driver board 812 is covered by cap 808 and potted with an insulating potting material 826. Cap 808 is made of plastic or another suitable material. Driver board 812 is made of a high temperature material, such as a ceramic polyimide or epoxy (for epoxy, glass transition temperature is greater than 150° C. or 170° C.). Power module 800 includes a package pedestal for drive terminals at the top of the cap 808 as indicated at 822. The separation level for the cap-module is indicated at 828. A housing 818 encloses power module 800.

Embodiments provide circuitry between a common driver signal and each individual gate and auxiliary emitter of each device of paralleled devices where the current flows along a direction in which the devices are paralleled. The circuitry shifts the driver signal at each device to compensate for the inductive voltage drop at the power emitters. The circuitry ensures that individual gate signals at each device are in phase with and at the same magnitude as the common driver signal. Therefore, the profile (i.e., voltage and time) of the common gate signal is reproduced at each gate of each individual device.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device comprising:
a first transistor;
a second transistor coupled in parallel with the first transistor;
a first parasitic inductance between an emitter of the first transistor and an emitter of the second transistor;
a first circuit providing galvanic isolation and configured to provide a first gate driver signal to the first transistor based on a common driver signal; and
a second circuit providing galvanic isolation and configured to provide a second gate driver signal to the second transistor based on the common driver signal,
wherein the first circuit and the second circuit are configured to compensate for a voltage drop across the first parasitic inductance such that the first gate driver signal and the second gate driver signal are in phase with and at the same magnitude as the common driver signal.

2. The semiconductor device of claim 1, further comprising:
a first diode coupled between a collector and the emitter of the first transistor; and
a second diode coupled between a collector and the emitter of the second transistor.

3. The semiconductor device of claim 1,
wherein the first circuit comprises:
a first isolated voltage supply; and
a first isolated driver coupled to the first isolated voltage supply, the first isolated driver configured to receive the common driver signal and to provide the first gate driver signal based on the common driver signal; and
wherein the second circuit comprises:
a second isolated voltage supply; and
a second isolated driver coupled to the second isolated voltage supply, the second isolated driver configured to receive the common driver signal and to provide the second gate driver signal based on the common driver signal.

4. The semiconductor device of claim 1, further comprising:
a third transistor coupled in series with the first transistor;
a fourth transistor coupled in series with the second transistor and in parallel with the third transistor;
a second parasitic inductance between an emitter of the third transistor and an emitter of the fourth transistor;
a third circuit configured to provide a third gate driver signal to the third transistor based on a further common driver signal; and
a fourth circuit configured to provide a fourth gate driver signal to the fourth transistor based on the further common driver signal,
wherein the third circuit and the fourth circuit are configured to compensate for a voltage drop across the second parasitic inductance such that the third gate driver signal and the fourth gate driver signal are in phase with and at the same magnitude as the further common driver signal.

5. The semiconductor device of claim 1, further comprising:
an isolated voltage supply,
wherein the first circuit comprises a first isolated driver coupled to the isolated voltage supply via first decoupling resistors, the first isolated driver configured to receive the common driver signal and to provide the first gate driver signal based on the common driver signal, and
wherein the second circuit comprises a second isolated driver coupled to the isolated voltage supply via second decoupling resistors, the second isolated driver configured to receive the common driver signal and to provide the second gate driver signal based on the common driver signal.

6. The semiconductor device of claim 5, wherein the isolated voltage supply provides a DC+ voltage, a DC− voltage, and a ground signal,
wherein the first circuit comprises a first capacitor and a second capacitor, the first capacitor coupled between a first DC+ voltage signal path and a first ground signal path, and the second capacitor coupled between a first DC− voltage signal path and the first ground signal path, and
wherein the second circuit comprises a third capacitor and a fourth capacitor, the third capacitor coupled between a second DC+ voltage signal path and a second ground signal path, and the fourth capacitor coupled between a second DC− voltage signal path and the second ground signal path.

7. The semiconductor device of claim 1, further comprising:
an isolated voltage supply,
wherein the first circuit comprises a first isolated driver coupled to the isolated voltage supply via a first coupled common mode choke, the first isolated driver configured to receive the common driver signal and to provide the first gate driver signal based on the common driver signal, and
wherein the second circuit comprises a second isolated driver coupled to the isolated voltage supply via a second coupled common mode choke, the second isolated driver configured to receive the common driver signal and to provide the second gate driver signal based on the common driver signal.

8. The semiconductor device of claim 7, wherein the isolated voltage supply provides a DC+ voltage, a DC− voltage, and a ground signal,
wherein the first circuit comprises a first capacitor and a second capacitor, the first capacitor coupled between a first DC+ voltage signal path and a first ground signal path, and the second capacitor coupled between a first DC− voltage signal path and the first ground signal path, and
wherein the second circuit comprises a third capacitor and a fourth capacitor, the third capacitor coupled between a second DC+ voltage signal path and a second ground signal path, and the fourth capacitor coupled between a second DC− voltage signal path and the second ground signal path.

9. The semiconductor device of claim 1,
wherein the first circuit comprises:
a first isolated voltage supply;
a first isolated driver coupled to the first isolated voltage supply, the first isolated driver configured to receive the common driver signal and to provide a first signal based on the common driver signal; and
a first current amplifier coupled to the first isolated voltage supply, the first current amplifier configured to receive the first signal and to provide the first gate driver signal based on the first signal; and
wherein the second circuit comprises:
a second isolated voltage supply;
a second isolated driver coupled to the second isolated voltage supply, the second isolated driver configured to receive the common driver signal and to provide a second signal based on the common driver signal; and
a second current amplifier coupled to the second isolated voltage supply, the second current amplifier configured to receive the second signal and to provide the second gate driver signal based on the second signal.

10. The semiconductor device of claim 9, wherein the first current amplifier comprises one of an emitter follower, a push-pull amplifier, and a voltage controlled current source, and
wherein the second current amplifier comprises one of an emitter follower, a push-pull amplifier, and a voltage controlled current source.

11. The semiconductor device of claim 1,
wherein the first circuit comprises:
a first isolated voltage supply;
a first coupled common mode choke configured to receive the common driver signal and to provide a first signal based on the common driver signal;
a first driver coupled to the isolated voltage supply, the first driver configured to receive the first signal and to provide a second signal based on the first signal; and
a first current amplifier coupled to the isolated voltage supply, the first current amplifier configured to receive the second signal and to provide the first gate driver signal based on the second signal; and
wherein the second circuit comprises:
a second isolated voltage supply;
a second coupled common mode choke configured to receive the common driver signal and to provide a third signal based on the common driver signal;
a second driver coupled to the isolated voltage supply, the second driver configured to receive the third signal and to provide a fourth signal based on the third signal; and
a second current amplifier coupled to the isolated voltage supply, the second current amplifier configured to receive the fourth signal and to provide the second gate driver signal based on the fourth signal.

12. The semiconductor device of claim 11, wherein the first current amplifier comprises one of an emitter follower, a push-pull amplifier, and a voltage controlled current source, and
wherein the second current amplifier comprises one of an emitter follower, a push-pull amplifier, and a voltage controlled current source.

13. A power module comprising:
a first switching device;
a second switching device coupled in parallel with the first switching device;
a first parasitic inductance between the first and second switching devices;
a first circuit providing galvanic isolation and configured to receive a common driver signal and to provide a first signal to the first switching device for controlling the switching of the first switching device based on the common driver signal; and
a second circuit providing galvanic isolation and configured to receive the common driver signal and to provide a second signal to the second switching device for controlling the switching of the second switching device based on the common driver signal,
wherein the first circuit and the second circuit are each configured to compensate for a voltage drop across the first parasitic inductance such that the first signal and the second signal are in phase with and at the same magnitude as the driver signal.

14. The power module of claim 13, wherein the first circuit comprises a first isolated DC to DC converter powering a first isolated driver, the first isolated driver configured to receive the common driver signal and to provide the first signal based on the common driver signal; and
wherein the second circuit comprises a second isolated DC to DC converter powering a second isolated driver, the second isolated driver configured to receive the common driver signal and to provide the second signal based on the common driver signal.

15. The power module of claim 13, further comprising:
an isolated DC to DC converter providing a DC+ voltage, a DC− voltage, and a ground signal;
wherein the first circuit comprises first decoupling resistors coupled between the isolated DC to DC converter and a first isolated driver, a first capacitor coupled between a first DC+ voltage signal path and a first ground signal path, and a second capacitor coupled between a first DC− voltage signal path and the first ground signal path, the first isolated driver configured to receive the common driver signal and to provide the first signal based on the common driver signal; and wherein the second circuit comprises second decoupling resistors coupled between the isolated DC to DC converter and a second isolated driver, a third capacitor coupled between a second DC+ voltage signal path and a second ground signal path, and a fourth capacitor coupled between a second DC− voltage signal path and the second ground signal path, the second isolated driver configured to receive the common driver signal and to provide the second signal based on the common driver signal.

16. The power module of claim 13, further comprising:
an isolated DC to DC converter providing a DC+ voltage, a DC− voltage, and a ground signal;
wherein the first circuit comprises a first coupled common mode choke coupled between the isolated DC to DC converter and a first isolated driver, a first capacitor coupled between a first DC+ voltage signal path and a first ground signal path, and a second capacitor coupled between a first DC− voltage signal path and the first ground signal path, the first isolated driver configured to receive the common driver signal and to provide the first signal based on the common driver signal; and
wherein the second circuit comprises a second coupled common mode choke coupled between the isolated DC to DC converter and a second isolated driver, a third capacitor coupled between a second DC+ voltage signal path and a second ground signal path, and a fourth capacitor coupled between a second DC− voltage signal path and the second ground signal path, the second isolated driver configured to receive the common driver signal and to provide the second signal based on the common driver signal.

17. The power module of claim 13, wherein the first circuit comprises a first isolated DC to DC converter powering a first isolated driver and a first current amplifier, the first isolated driver configured to receive the common driver signal and to provide a third signal based on the common driver signal, and the first current amplifier configured to receive the third signal and to provide the first signal based on the third signal; and
wherein the second circuit comprises a second isolated DC to DC converter powering a second isolated driver and a second current amplifier, the second isolated driver configured to receive the common driver signal and to provide a fourth signal based on the common driver signal, and the second current amplifier configured to receive the fourth signal and to provide the second signal based on the fourth signal.

18. The power module of claim 13, wherein the first circuit comprises a first coupled common mode choke and a first isolated DC to DC converter powering a first driver and a first current amplifier, the first coupled common mode choke configured to receive the common driver signal to provide a third signal based on the common driver signal, the first driver configured to receive the third signal and to provide a fourth signal based on the third signal, and the first current amplifier configured to receive the fourth signal and to provide the first signal based on the fourth signal; and
wherein the second circuit comprises a second coupled common mode choke and a second isolated DC to DC converter powering a second driver and a second current amplifier, the second coupled common mode choke configured to receive the common driver signal and to provide a fifth signal based on the common driver signal, the second driver configured to receive the fifth signal and to provide a sixth signal based on the fifth signal, and the second current amplifier configured to receive the sixth signal and to provide the second signal based on the sixth signal.

19. A method for switching devices in a power circuit with paralleled devices, the method comprising:
receiving a common driver signal configured for switching each of the devices; and
galvanic isolating and shifting the common driver signal to provide an individual device driver signal at each device to compensate for an inductive voltage drop between each device such that each individual device driver signal at each device is in phase with and at the same magnitude as the common driver signal.

20. The method of claim 19, wherein shifting the common driver signal comprises:
individually isolating a voltage supply for each device; and
individually isolating the common driver signal via an isolated driver powered by the respective isolated voltage supply for each device to provide the individual device driver signal at each device.

21. The method of claim 19, wherein shifting the common driver signal comprises:
isolating a voltage supply;
individually decoupling the voltage supply from an isolated driver for each device; and
individually isolating the common driver signal via the isolated driver for each device to provide the individual device driver signal at each device.

22. The method of claim 19, wherein shifting the common driver signal comprises:
individually isolating a voltage supply for each device; and
individually isolating the common driver signal via an isolated driver and a current amplifier powered by the respective isolated voltage supply for each device to provide the individual device driver signal at each device.

* * * * *